United States Patent
Peng et al.

(10) Patent No.: US 7,338,903 B2
(45) Date of Patent: Mar. 4, 2008

(54) SEQUENTIAL REDUCING PLASMA AND INERT PLASMA PRE-TREATMENT METHOD FOR OXIDIZABLE CONDUCTOR LAYER

(75) Inventors: Chao-Hsien Peng, Hsinchu (TW); Jing-Cheng Lin, Hsinchu (TW); Ching-Hua Hsieh, Hsinchu (TW); Shau-Lin Shue, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 122 days.

(21) Appl. No.: 10/910,182

(22) Filed: Aug. 2, 2004

(65) Prior Publication Data
US 2005/0239288 A1    Oct. 27, 2005

Related U.S. Application Data

(60) Provisional application No. 60/565,039, filed on Apr. 24, 2004.

(51) Int. Cl.
*H01L 21/44*    (2006.01)

(52) U.S. Cl. ............... 438/687; 438/586; 438/710; 438/706; 438/685; 438/637; 257/E21.252

(58) Field of Classification Search ............... 438/687, 438/685, 637, 706, 710, 586; 257/E21.169, 257/E21.252
See application file for complete search history.

(56) References Cited

U.S. PATENT DOCUMENTS

| | | | |
|---|---|---|---|
| 6,656,832 B1 * | 12/2003 | Pan et al. | 438/627 |
| 6,796,642 B2 * | 9/2004 | Toba et al. | 347/85 |
| 2002/0157610 A1 * | 10/2002 | Sekiguchi et al. | 118/723 VE |
| 2002/0162736 A1 * | 11/2002 | Ngo et al. | 204/192.12 |
| 2002/0173142 A1 * | 11/2002 | Vanhaelemeersch et al. | 438/637 |
| 2003/0224595 A1 * | 12/2003 | Smith et al. | 438/637 |

* cited by examiner

*Primary Examiner*—B. William Baumeister
*Assistant Examiner*—Igwe U. Anya
(74) *Attorney, Agent, or Firm*—Tung & Associates

(57) ABSTRACT

A method for forming a barrier layer upon a copper containing conductor layer employs a hydrogen containing plasma treatment of the copper containing conductor layer followed by an argon plasma treatment of the copper containing conductor layer. The barrier layer may be formed employing a chemical vapor deposition method, such as an atomic layer deposition method. When the deposition method employs a metal and carbon containing source material, the two-step plasma pretreatment provides the barrier layer with enhanced electrical properties.

50 Claims, 4 Drawing Sheets

SEQUENTIAL REDUCING PLASMA AND INERT PLASMA PRE-TREATMENT METHOD FOR OXIDIZABLE CONDUCTOR LAYER

This application claims the benefit of Provisional Application No. 60/565,039 filed on Apr. 24, 2004.

BACKGROUND OF THE INVENTION

The invention relates generally to methods for fabricating microelectronic products. More particularly, the invention relates to methods for cleaning oxidizable conductor layers when fabricating microelectronic products.

DESCRIPTION OF THE RELATED ART

Microelectronic products are formed from substrates over which are formed patterned conductor layers that are separated by dielectric layers.

As microelectronic product integration levels have increased, it has become common to fabricate microelectronic products while employing patterned copper containing conductor material layers that are separated by low dielectric constant dielectric material layers. Copper containing conductor materials are desirable when fabricating microelectronic products insofar as they provide for enhanced electrical conductivity. Low dielectric constant dielectric materials, which are intended as dielectric materials having a dielectric constant of less than about 4.0, are desirable insofar as they provide microelectronic products with attenuated cross-talk.

Although copper containing conductor materials in conjunction with low dielectric constant dielectric materials are common and desirable when fabricating microelectronic products, they are nonetheless not entirely without problems. In particular, copper containing conductor materials often detrimentally interdiffuse with low dielectric constant dielectric materials when fabricating microelectronic products. In addition, copper containing conductor materials are often susceptible to corrosion and oxidation, while low dielectric constant dielectric materials are often mechanically fragile materials. The foregoing materials limitations often provide microelectronic products with compromised electrical performance and reliability.

A need thus exists for fabricating microelectronic products with copper containing conductor material layers separated by low dielectric constant dielectric material layers, with enhanced electrical performance and reliability.

The invention is directed towards the foregoing object.

SUMMARY OF THE INVENTION

A first object of the invention is to provide a method for fabricating a microelectronic product having a patterned copper containing conductor material layer separated by a low dielectric constant dielectric material layer.

A second object of the invention is to provide a method in accord with the first object of the invention, where the microelectronic product is fabricated with enhanced electrical performance and reliability.

In accord with the objects of the invention, the invention provides a method for fabricating a microelectronic product.

A more specific embodiment of the invention first provides a substrate. A copper containing conductor layer is formed over the substrate. The copper containing conductor layer is treated with a hydrogen containing plasma to form a hydrogen containing plasma treated copper containing conductor layer. Finally, the hydrogen containing plasma treated copper containing conductor layer is treated with an argon containing plasma to form a fully treated copper containing conductor layer.

A second conductor layer, such as a conductor barrier layer, may then be formed upon the fully treated copper containing conductor layer incident to further processing of the microelectronic product. The second conductor layer may be formed employing a deposition method such as a chemical vapor deposition method, or more particularly an atomic layer deposition method, that employs a metal and carbon containing volatile source material. The resulting second conductor layer is formed with enhanced electrical properties that provide the microelectronic product with enhanced reliability.

In a more general embodiment, the invention is broadly intended as providing a reducing plasma and inert plasma treatment method for cleaning an oxidizable conductor layer. In a particular embodiment, the invention providing a sequential reducing plasma and inert plasma treatment for cleaning and oxidizable conductor layer. A second conductor layer may then be formed upon the sequentially plasma treated oxidizable conductor layer to provide the same with enhanced electrical properties and reliability when the second conductor layer is formed employing a chemical vapor deposition method, such as an atomic layer deposition method, and while employing a metal and carbon containing source material.

The method of the invention contemplates a microelectronic product fabricated in accord with the method of the invention.

The invention provides a method for fabricating a microelectronic product having a patterned copper containing conductor material layer separated by a low dielectric constant dielectric material layer, with enhanced reliability.

The invention realizes the foregoing object by employing a hydrogen containing plasma treatment (i.e., generally a reducing plasma treatment (RPT)) followed by an argon containing plasma treatment (i.e., generally an inert plasma treatment) for a copper containing conductor layer within a microelectronic product. After the sequential plasma treatments, a second conductor material layer such as a conductor barrier material layer may be deposited upon the completely treated copper containing conductor layer to provide the same with enhanced electrical properties and reliability within a microelectronic product. The invention is particularly useful when the second conductor material layer is formed employing a chemical vapor deposition method, such as an atomic layer deposition method, employing a metal and carbon containing source material.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention provides a method for fabricating a microelectronic product having a patterned conductor material layer separated by a low dielectric constant dielectric material layer, with enhanced electrical performance and reliability.

In a specific embodiment, the invention realizes the foregoing object by employing a hydrogen containing plasma treatment followed by an argon containing plasma treatment for a conductor layer within the microelectronic fabrication. In one embodiment, the patterened conductor layer is a copper containing layer. After the plasma treatments, a second conductor layer, such as a conductor barrier material layer, may be deposited upon the completely treated conductor layer to provide the same with enhanced electrical performance and reliability within the microelectronic product.

In a more general embodiment, the invention is directed towards a reducing plasma treatment followed by an inert plasma treatment of an oxidizable conductor layer. A second conductor layer may then be formed upon the sequentially plasma treated oxidizable conductor layer with enhanced electrical properties and reliability.

Figure 1:
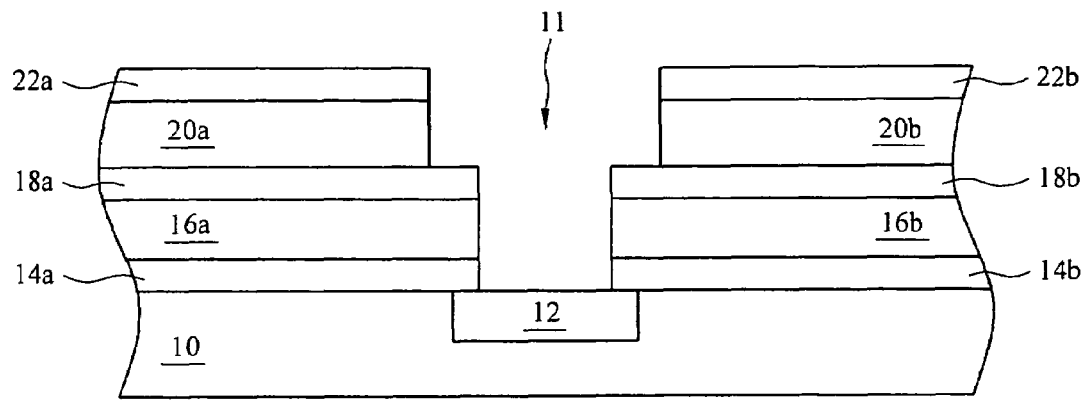
FIG. 1, FIG. 2, FIG. 3, FIG. 4, FIG. 5 and FIG. 6 show a series of schematic cross-sectional diagrams illustrating the results of progressive stages in fabricating a microelectronic product in accord with a preferred embodiment of the invention.

FIG. 1 to FIG. 6 show a series of schematic cross-sectional diagrams illustrating the results of progressive stages in fabricating a microelectronic product in accord with a preferred embodiment of the invention. FIG. 1 shows a schematic cross-sectional diagram of the microelectronic product at an early stage in its fabrication.

FIG. 1(a) shows a substrate 10. A patterned copper containing conductor layer 12 is formed within the substrate 10. A portion of the patterned copper containing conductor layer 12 is exposed within a damascene aperture 11. The damascene aperture is defined by: (1) a pair of patterned barrier layers 14a and 14b; (2) a pair of patterned dielectric layers 16a and 16b formed substantially aligned upon the pair of patterned barrier layers 14a and 14b; (3); As FIG. 1(b), the damascence opening could be a dual damascene opening with a trench opening and a via opening defined into the dielectric layers 16 and barrier layer 14. In one embodiment, there are further a etch stop layer 18 overlying the dielectric layer 16. In another embodiment, there is also another dielectric layer 20 and another barrier dielectric layer 22 overlying the dielectric layer 16 to be defined while patterning the damascene opening or dual damascene opening.

The substrate 10 may be employed within a microelectronic product selected from the group including but not limited to integrated circuit products, ceramic substrate products and optoelectronic products. Typically, the substrate 10 includes a semiconductor substrate.

The patterned first copper containing conductor layer 12 may be formed of copper or a copper alloy. Typically, the patterned first copper containing conductor layer 12 is formed with a linewidth of from about 0.1 to about 10 microns and a thickness of from about 4000 to about 8000 angstroms.

In FIG. 1(a) and FIG. 1(b). The pair of patterned first dielectric layers 16a and 16b and the pair of patterned second dielectric layers 20a and 20b may be formed from any of several dielectric materials. Such dielectric layers may include, but are not limited to generally higher dielectric constant dielectric materials (i.e., having a dielectric constant of greater than about 4.0, such as silicon containing, oxygen containing, carbon containing material and nitrogen containing dielectric materials). Such dielectric materials may also include, but are not limited to generally lower dielectric constant dielectric materials (i.e., having a dielectric constant less than about 4.0, such as spin-on-glass dielectric materials, spin-on-polymer dielectric materials, fluorosilicate glass dielectric materials and amorphous carbon dielectric materials).

Each of the pair of patterned first barrier layers 14a and 14b, the pair of patterned etch stop layers 18a and 18b and the pair of patterned planarizing stop layers 22a and 22b is typically formed of higher dielectric constant dielectric materials when the pair of patterned first dielectric layers 16a and 16b and the pair of patterned second dielectric layers 20a and 20b is formed of a comparatively lower dielectric constant dielectric material.

Typically: (1) each of the pair of patterned first barrier layers 14a and 14b is formed to a thickness of from about 200 to about 500 angstroms; (2) each of the pair of patterned first dielectric layers 16a and 16b is formed to a thickness of from about 1000 to about 4000 angstroms; (3) each of the pair of patterned etch stop layers 18a and 18b is formed to a thickness of from about 200 to about 500 angstroms; (4) each of the pair of patterned second dielectric layers 20a and 20b is formed to a thickness of from about 1000 to about 4000 angstroms; and (5) each of the pair of patterned planarizing stop layers 22a and 22b is formed to a thickness of from about 200 to about 500 angstroms.

Figure 2:
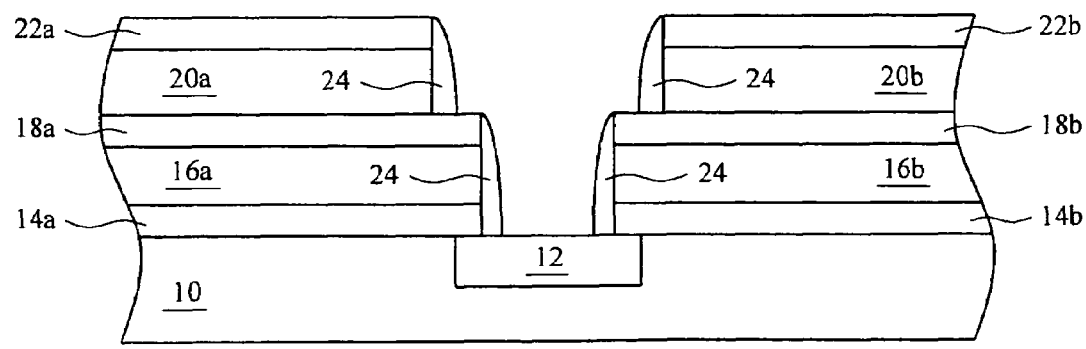

In one embodiment, the dielectric layer 16 or 20 is a low dielectric layer with porosity therein. An additional sidewall protecting layer is needed to present as a sealing layer for such a porosity containing low k dielectric layer (namely, called a porous low k dielectric material). FIG. 2 shows the results of forming a series the optional sidewall protecting layers 24 upon sidewall surfaces within the dual damascene aperture 11. The series of optional sidewall protecting layers 24 is typically formed employing a deposition and anisotropic etch method as is otherwise generally conventional in the microelectronic product fabrication art. Typically, the series of sidewall protecting layers 24 is formed of a higher dielectric constant dielectric material with dielectric constant more than about 4.0, such as a oxide containing or a nitrogen containing dielectric material. The sidewall protecting layer is formed by a method employing CVD, MOCVD, PECVD or HDP process.

Figure 3:
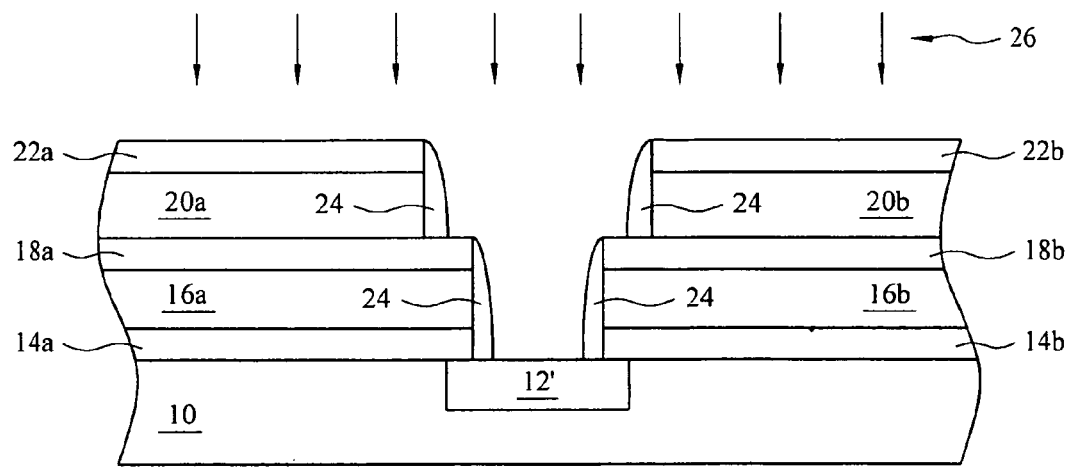

FIG. 3 shows the results of treating the microelectronic product of FIG. 2 with a hydrogen containing plasma 26. The hydrogen containing plasma 26 treatments of the patterned copper containing conductor layer 12 forms therefrom a hydrogen containing plasma treated copper containing conductor layer 12'. The hydrogen containing plasma 26 treatment is typically intended to chemically reduce and eliminate oxidation residues formed upon the patterned copper containing conductor layer 12.

The hydrogen containing plasma 26 is provided at: (1) a reactor chamber pressure of from about 1 to about 100 mtorr; (2) a radio frequency source power of from about 100 to about 1000 watts and a bias power of from about 100 to about 1000 watts; (3) a substrate (and patterned first copper containing conductor layer 12) temperature of from about 100 to about 200 degrees centigrade; (4) a hydrogen flow rate of from about 100 to about 5000 standard cubic centimeters per minute; and (5) a treatment time of from about 10 to about 200 seconds. The hydrogen containing plasma may also employ other reducing gases such as ammonia. The hydrogen containing plasma treatment would induce a recess portion on the copper containing conductor layer. In one embodiment, the recess portion on the copper containing conductor layer is about less than 500 angstroms.

Figure 4:
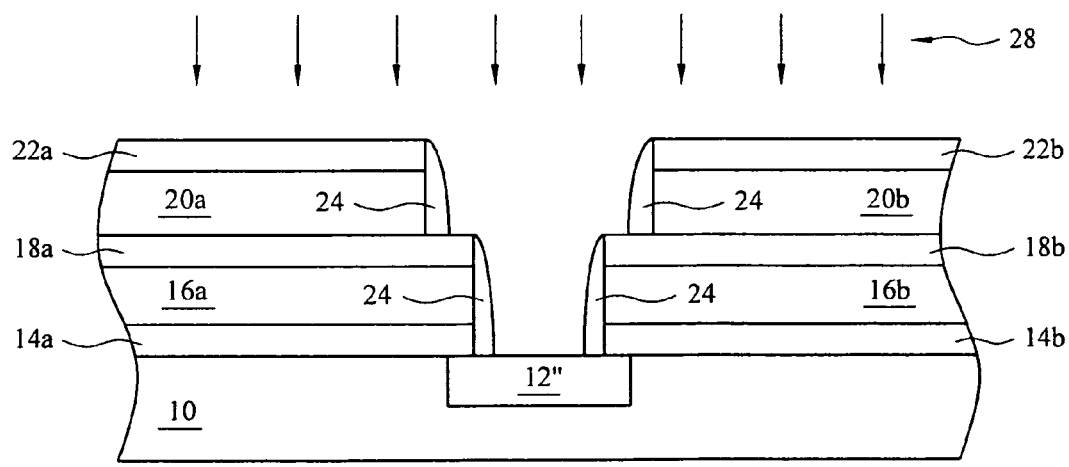

FIG. 4 shows the results of treating the microelectronic product of FIG. 3 with an argon containing plasma 28. The argon containing plasma 28 treats the hydrogen containing plasma treated patterned copper containing conductor layer 12' to form therefrom an argon and hydrogen containing plasma treated copper containing conductor layer 12", which is intended as a completely plasma treated copper containing conductor layer. As will be shown within the Examples which follow, the argon containing plasma 28 treatment of the hydrogen containing plasma treated copper containing conductor layer 12' provides a superior surface upon which may be formed a conductor layer, such as a conductor barrier layer, with superior electrical properties.

The argon containing plasma 28 is provided at: (1) a reactor chamber pressure of from about 1 to about 10 mtorr; (2) a radio frequency source power of from about 600 to about 800 watts (and more preferably from about 650 to about 750 watts) and a bias power of from about 10 to about 100 watts (and more preferably from about 20 to about 50 watts); (3) a substrate (and hydrogen containing plasma treated patterned copper containing conductor layer 12') temperature of from about 10 to about 200 degrees centigrade; (4) an argon flow rate of from about 1 to about 20 standard cubic centimeters per minute (and more preferably from about 5 to about 10 standard cubic centimeters per minute); and (5) a treatment time of from about 1 to about 20 seconds (and more preferably from about 5 to about 10 seconds). The foregoing conditions are intended to provide a generally "soft" argon plasma treatment of the hydrogen containing plasma treated copper containing conductor layer 12'. Other inert plasma gases may also be employed, including but not limited to helium, neon, krypton and xenon inert gases The hydrogen containing plasma treatment and argon containing plasma treatment could be sequential processes in a pre-clean chamber of a cluster PVD tool or in different chambers of a cluster PVD tool. The hydrogen containing plasma treatment and argon containing plasma treatment would induce a recess portion on the copper containing conductor layer. In one embodiment, the recess portion on the copper containing conductor layer is about less than 800 angstroms.

Figure 5:
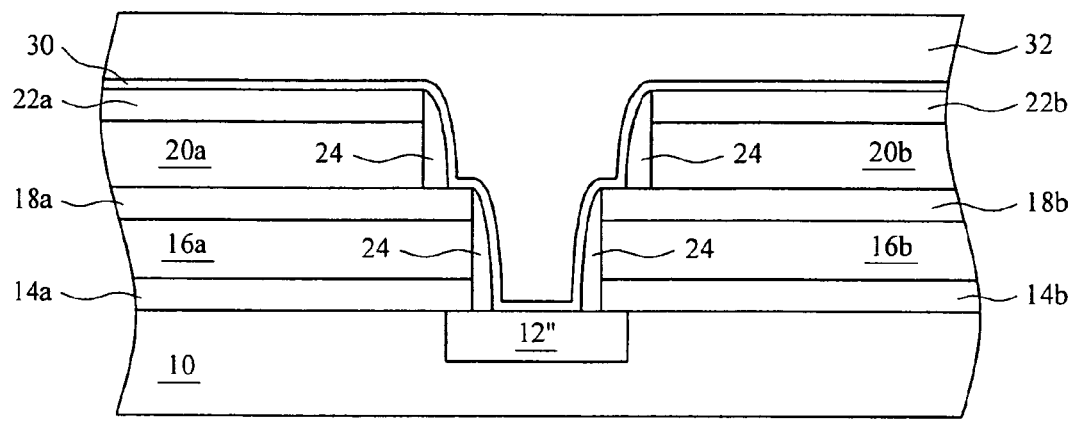

FIG. 5 first shows the results of forming a blanket barrier layer 30 upon the microelectronic product of FIG. 4, and in particular within the dual damascene aperture and contacting the argon and hydrogen containing plasma treated copper containing conductor layer 12". FIG. 5 also shows a blanket second copper containing conductor layer 32 formed upon the blanket barrier layer 30.

The blanket barrier layer 30 is a blanket conductor barrier layer that may be formed employing any of several methods and materials. The blanket barrier layer 30 may be formed employing physical vapor deposition methods, chemical vapor deposition methods and atomic layer deposition methods (which may be regarded as digital chemical vapor deposition methods). The atomic layer deposition method is generally a multi-layer deposition method. The blanket barrier layer 30 may be formed of conductor barrier materials including but not limited to tungsten, titanium, tantalum and nitrides thereof. Preferably, the blanket barrier layer 30 is formed of a tantalum nitride conductor barrier material formed employing an atomic layer deposition method employing penta-dimethylamino-tantalum as a vapor phase metal and carbon source material (i.e., $Ta((CH_3)_2N)_5$). In one embodiment, the blanket barrier layer is formed with a tantalum layer and tantalum nitride layer. The atomic layer deposition method also employs: (1) a reactor chamber pressure of from about 1 to about 10 mtorr without plasma activation; (2) a substrate 10 (including argon and hydrogen plasma treated copper containing conductor layer 12") temperature of from about 100 to about 200 degrees centigrade; (3) a penta-dimethylamino-tantalum source material concentration of about 0.1 to about 1.0 volume percent in a carrier gas flow of from about 100 to about 2000 standard cubic centimeters per minute. Typically, the blanket barrier layer 30 is formed to a thickness of from about 50 to about 500 angstroms. The atomic layer deposition method employs stepwise deposition of the above tantalum source material with stepwise evacuation and optionally stepwise nitrogen treatment to provide a tantalum nitride layer. The blank barrier layer formed by atomic layer deposition method would have different thickness on sidewall and on bottom of the dual damascene aperture due to surface conditions on sidewall and bottom are different. The surface condition on sidewall is a dielectric surface rather than a conductor surface on bottom. The deposition characteristic of atomic layer deposition is surface-dependent process in which the behavior of deposition would depend on the surface condition. In one embodiment, the thickness of barrier layer on sidewall is large than on bottom. Preferably, the sidewall barrier formed by atomic layer deposition is less than about 100 angstroms. The bottom barrier layer formed by atomic layer deposition is less than about 50 angstroms.

The blanket second copper containing conductor layer 32 is typically formed employing methods and materials analogous, equivalent or identical to the methods and materials as are employed for forming the patterned first copper containing conductor layer 12". Typically, the blanket second copper containing conductor layer 32 is formed to a thickness of from about 1000 to about 8000 angstroms.

Figure 6:
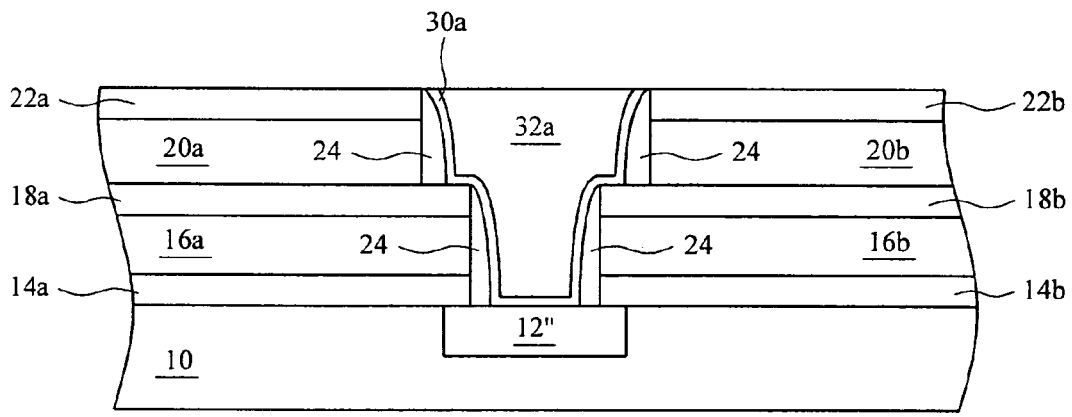

FIG. 6 shows the results of planarizing the blanket second copper containing conductor layer 32 and the blanket barrier layer 30 to form a patterned second copper containing conductor layer 32a formed upon a patterned barrier layer 30a and contacting the argon and hydrogen containing plasma treated patterned first copper containing conductor layer 12" within the dual damascene aperture. Such planarizing may be effected employing methods as are conventional in the microelectronic product fabrication art, and in particular chemical mechanical polish planarizing methods.

FIG. 6 shows a schematic cross sectional diagram of a microelectronic product fabricated in accord with a preferred embodiment of the invention. The microelectronic product includes a patterned first copper containing conductor layer, a barrier layer formed thereupon and a patterned second copper containing conductor layer further formed thereupon within the microelectronic product. The patterned second copper containing conductor layer and the patterned barrier layer are formed upon the patterned first copper containing conductor layer with enhanced electrical properties. The enhanced electrical properties provide the microelectronic product with enhanced reliability. The enhanced electrical properties and enhanced reliability are a result of treating the patterned first copper containing conductor layer with a hydrogen containing plasma followed by an argon containing plasma.

EXAMPLES

Several microelectronic products were fabricated in accord with the preferred embodiment of the invention while employing a hydrogen plasma treatment followed by an argon plasma treatment for a patterned first copper containing conductor layer. The hydrogen plasma treatment was provided at: (1) a reactor chamber pressure of about 50 mtorr; (2) a radio frequency source power of about 1000 watts and a radio frequency bias power of about 100 watts; (3) a substrate temperature of about 200 degrees centigrade; (4) a hydrogen flow rate of about 1000 standard cubic centimeters per minute (sccm); and (5) a treatment time of about 100 seconds. The argon plasma treatment was provided at: (1) a reactor chamber pressure of about 50 mtorr; (2) a source radio frequency power of about 700 watts and a bias radio frequency power of about 100 watts; (3) a substrate temperature of about 200 degrees centigrade; (4) an argon flow rate of about 10 standard cubic centimeters per minute; and (5) treatment times of 1, 4, 10 and 14 seconds.

For comparison purposes an additional microelectronic product was prepared employing only the hydrogen plasma treatment of the patterned first copper containing conductor layer and not any argon plasma treatment of the patterned first copper containing conductor layer.

Figure 7:
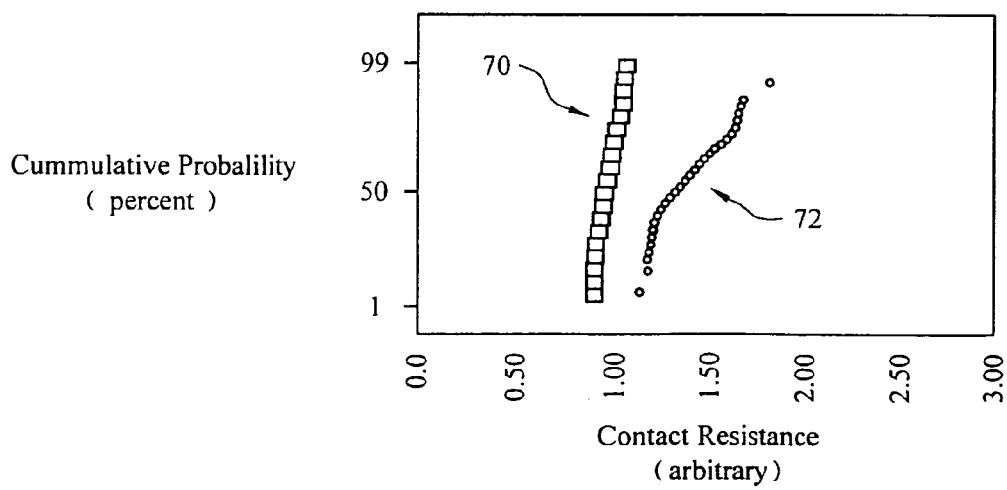
FIG. 7 shows a graph of Cumulative Probability versus Contact Resistance for microelectronic products fabricated in accord with the invention and not in accord with the invention.

Via resistances of the series of microelectronic products were measured employing methods as are conventional in the art. The results of the measurements are reported in the graph of FIG. 7. In FIG. 7, the data points corresponding with reference numeral 70 correspond with microelectronic products where the patterned first copper containing conductor layers were treated with both the hydrogen plasma and the argon plasma. The data points that correspond with reference numeral 72 correspond with the microelectronic product where the patterned first copper containing conductor layer was treated with the hydrogen plasma only.

As is seen from the graph of FIG. 7, microelectronic products where patterned first copper containing conductor layers are treated with both hydrogen plasmas and argon plasmas have a lower and more uniform contact resistance in comparison with a microelectronic product where a patterned first copper containing conductor layer is treated with only a hydrogen plasma.

Figure 8:
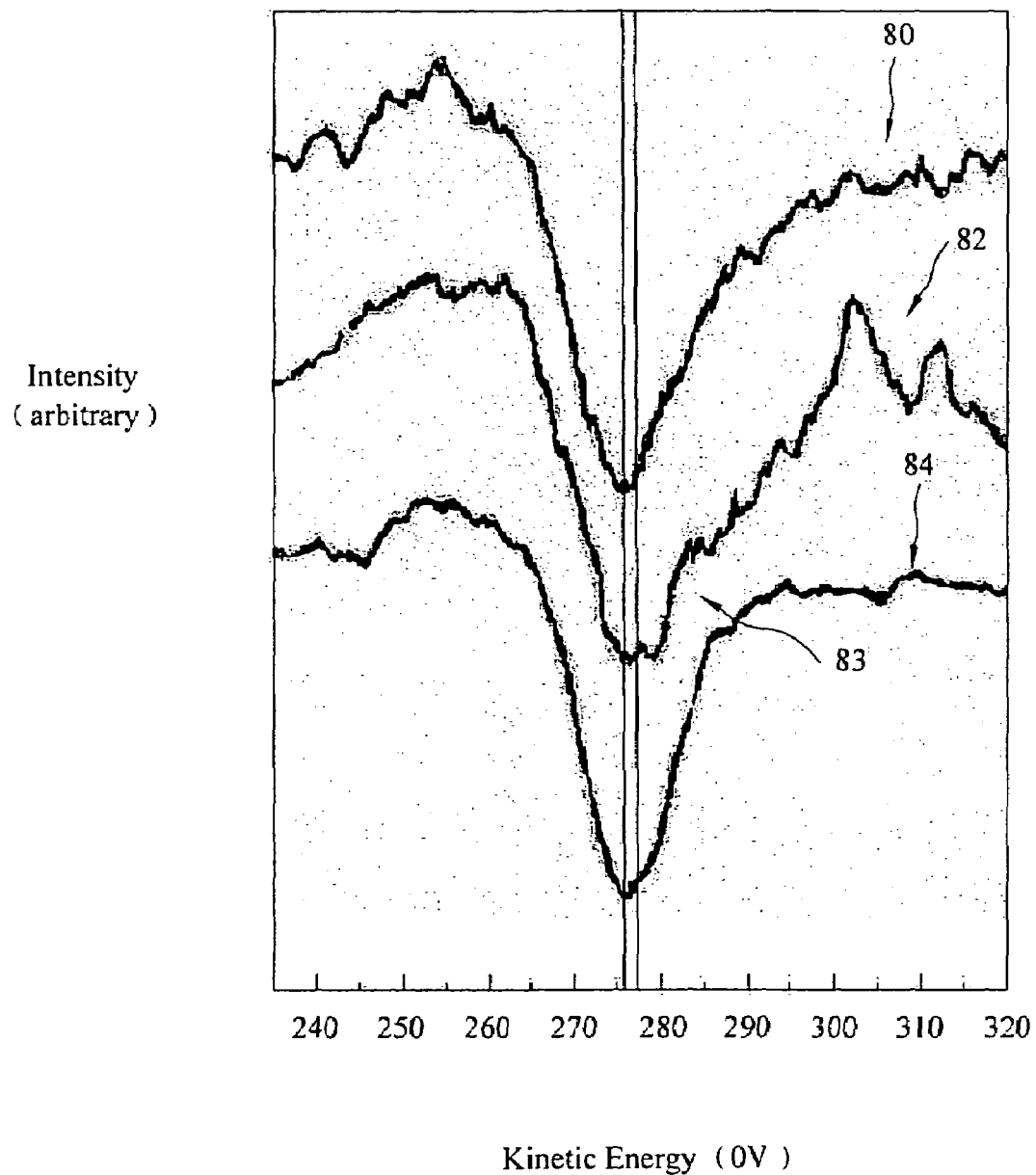
FIG. 8 shows a series of Atomic Emission Spectroscopy graphs for tantalum nitride layers formed in accord with the invention and not in accord with the invention.

In order to further investigate the source of the higher contact resistances, atomic emission spectra were obtained for tantalum nitride layers formed upon copper containing conductor layers in accord with the invention. The copper containing conductor layers were either: (1) as deposited; (2) with hydrogen containing plasma treatment only; or (3) with argon containing plasma treatment only. The results of the atomic emission spectra are illustrated in the graph of FIG. 8. In FIG. 8, the curve which corresponds with reference numeral 80 corresponds with no plasma treatment of a copper containing conductor layer. The curve which corresponds with reference numeral 82 corresponds with hydrogen plasma treatment only of the copper containing conductor layer. The curve which corresponds with reference numeral 84 corresponds with argon plasma treatment only of the copper containing conductor layer. All curves illustrate a characteristic absorbance at 275 eV that corresponds with adventitious atmospheric carbon absorption. However, the curve which corresponds with reference numeral 82 also includes an additional absorbance 83 at 278 eV. It is believed that this additional absorbance peak might be the result of a direct tantalum to carbon bonding.

Thus, while not wishing to be bound to any particular theory of operation of the invention, it is plausible that incident to a hydrogen plasma treatment of a copper containing conductor layer a hydrogenated surface remains on the copper containing conductor layer. The hydrogenated surface layer may be removed incident to argon containing (or inert) plasma treatment. If not removed, the hydrogenated surface may impede an atomic layer deposition chemical vapor deposition process for conductor layer formation, particularly when the atomic layer deposition chemical vapor deposition method employs as a source material a metal and carbon containing source material.

In accord with the foregoing understanding, the invention clearly has broader implications than merely forming a tantalum nitride barrier layer upon a copper containing conductor layer. Rather, the invention is applicable for treating any conductor base layer susceptible to forming an oxide or other residue that may be removed while employing a hydrogen containing plasma. The invention is presumably also applicable under any circumstances where a second conductor layer, such as a conductor barrier layer, is formed upon the copper containing conductor layer while employing a metal and carbon containing source material.

The preferred embodiment and examples of the invention are illustrative of the invention rather than limiting of the invention. Revisions and modifications may be made to methods, materials, structures and dimensions of a microelectronic product in accord with the preferred embodiment of the invention, while still providing a microelectronic product in accord with the invention, further in accord with the accompanying claims.

What is claimed is:

1. A method for fabricating a microelectronic product comprising:
    providing a substrate having formed thereover a copper containing conductor layer;
    forming a dielectric on the copper containing conductor layer;
    forming an opening extending into the dielectric layer and over the copper containing conductor layer;
    forming a sidewall protecting layer in the opening;
    treating the copper containing conductor layer with a hydrogen containing plasma to form a hydrogen containing plasma treated copper containing conductor layer; and
    treating the hydrogen containing plasma treated copper containing conductor layer with an argon plasma to form a fully treated copper containing conductor layer.

2. The method of claim 1 wherein the hydrogen containing plasma is selected from the group consisting of hydrogen plasmas and ammonia plasmas.

3. The method of claim 1 further comprising forming upon the fully treated copper containing conductor layer a second conductor layer.

4. The method of claim 3 wherein the second conductor layer is formed employing a vapor deposition method employing a metal and carbon containing source material.

5. The method of claim 3, wherein the second conductor layer is a barrier layer lining the opening having a thickness on the bottom less than on the sidewalls.

6. The method of claim 5, wherein the barrier layer is a layer selected from the group consisting of TaN, WN, TiN and CrN.

7. The method of claim 5, wherein the barrier layer is a TaN layer.

8. The method of claim 5, wherein the barrier layer comprises multi-layers of conductor material containing layers.

9. The method of claim 1 wherein the dielectric layer is a low dielectric constant dielectric layer.

10. The method of claim 9 wherein the dielectric layer has a dielectric constant less than about 3.0.

11. The method of claim 1 wherein the sidewall protecting layer is formed by a process selected from the group consisting of CVD, PECVD, HDP, SOG and ALD process.

12. The method of claim 1 wherein the sidewall protecting layer is formed by PECVD process.

13. The method of claim 1, further comprising forming a recessed portion on the copper containing conductor layer.

14. The method of claim 13 wherein the recessed portion is less than about 800 angstroms.

15. The method of claim 1 wherein the hydrogen containing plasma and the argon plasma are provided at about the same radio frequency source power and bias power.

16. The method of claim 1 wherein the hydrogen containing plasma and the argon plasma are provided with a radio frequency source power from about 600 to about 800 watts and a bias power from about 10 to about 100 watts.

17. The method of claim 1, wherein the sidewall protecting layer has a dielectric constant greater than about 4.0.

18. The method of claim 1, wherein the sidewall protecting layer is an oxygen containing layer.

19. The method of claim 1, wherein the sidewall protecting layer is an nitrogen containing layer.

20. The method of claim 1, wherein the sidewall protecting layer is a hydrogen containing layer.

21. The method of claim 1, further comprising forming a copper containing layer to fill the opening.

22. A method for fabricating a microelectronic product comprising:
providing a substrate having formed thereover a copper containing conductor layer;
forming a dielectric on the copper containing conductor layer;
forming an opening extending into the dielectric layer and over the copper containing conductor layer;
treating the copper containing conductor layer with a hydrogen containing plasma to form a hydrogen containing plasma treated copper containing conductor layer;
treating the hydrogen containing plasma treated copper containing conductor layer with an argon plasma to form a fully treated copper containing conductor layer; and,
forming upon the fully treated copper containing conductor layer a second conductor layer;
wherein the second conductor layer is formed employing a vapor deposition method employing a metal and carbon containing source material.

23. The method of claim 22 wherein the hydrogen containing plasma is selected from the group consisting of hydrogen plasmas and ammonia plasmas.

24. The method of claim 22 wherein the dielectric layer is a low dielectric constant dielectric layer.

25. The method of claim 24 wherein the dielectric layer has a dielectric constant less than about 3.0.

26. The method of claim 22, further comprising forming a sidewall protecting layer in the opening.

27. The method of claim 26, wherein the sidewall protecting layer is an oxygen containing layer.

28. The method of claim 26, wherein the sidewall protecting layer is a nitrogen containing layer.

29. The method of claim 26, wherein the sidewall protecting layer is a hydrogen containing layer.

30. The method of claim 26 wherein the sidewall protecting layer is formed by a process selected from the group consisting of CVD, PECVD, HDP, SOG and ALD process.

31. The method of claim 26 wherein the sidewall protecting layer is formed by PECVD process.

32. The method of claim 26, wherein the sidewall protecting layer has a dielectric constant greater than about 4.0.

33. The method of claim 22, further comprising forming a recessed portion on the copper containing conductor layer.

34. The method of claim 33 wherein the recessed portion is less than about 800 angstroms.

35. The method of claim 22 wherein the hydrogen containing plasma and the argon plasma are provided at about the same radio frequency source power and bias power.

36. The method of claim 22 wherein the hydrogen containing plasma and the argon plasma are provided at a radio frequency source power from about 600 to about 800 watts and a bias power from about 10 to about 100 watts.

37. The method of claim 22, wherein the second conductor layer is a barrier layer lining the opening having a thickness on the bottom less than on the sidewalls.

38. The method of claim 22, wherein the barrier layer is a layer selected from the group consisting of TaN, WN, TiN and CrN.

39. The method of claim 22, wherein the barrier layer is a TaN layer.

40. The method of claim 22, wherein the barrier layer comprises multi-layers of conductor material containing layers.

41. The method of claim 22, further comprising forming a copper containing layer to fill the opening.

42. A method for fabricating a microelectronic product comprising:
providing a substrate having formed thereover a copper containing conductor layer;
forming a dielectric on the copper containing conductor layer;
forming an opening extending into the dielectric layer and over the cooper containing conductor layer;
treating the copper containing conductor layer with a hydrogen containing plasma to form a hydrogen containing plasma treated copper containing conductor layer; and
treating the hydrogen containing plasma treated copper containing conductor layer with an argon plasma to form a fully treated copper containing conductor layer;
wherein the hydrogen containing plasma and the argon plasma are provided with a radio frequency source power from about 600 to about 800 watts and a bias power from about 10 to about 100 watts.

43. The method of claim 42, further comprising forming a sidewall protecting layer in the opening.

44. The method of claim 43, wherein the sidewall protecting layer is an oxygen containing layer.

45. The method of claim 43, wherein the sidewall protecting layer is a nitrogen containing layer.

46. The method of claim 43, wherein the sidewall protecting layer is a hydrogen containing layer.

47. The method of claim 43, wherein the sidewall protecting layer has a dielectric constant greater than about 4.0.

48. The method of claim 42 wherein the hydrogen containing plasma is selected from the group consisting of hydrogen plasmas and ammonia plasmas.

49. The method of claim 42 further comprising forming upon the fully treated copper containing conductor layer a second conductor layer.

50. The method of claim 42 wherein the second conductor layer is formed employing a vapor deposition method employing a metal and carbon containing source material.

* * * * *